(12) United States Patent
Iwanaga et al.

(10) Patent No.: US 6,909,372 B2
(45) Date of Patent: Jun. 21, 2005

(54) POWER MONITORING UNIT, CONTROL METHOD THEREFOR, AND EXPOSURE APPARATUS

(75) Inventors: Takehiko Iwanaga, Tochigi (JP); Kazuhito Outsuka, Tokyo (JP); Toshiyuki Shigaraki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 71 days.

(21) Appl. No.: 10/662,471

(22) Filed: Sep. 16, 2003

(65) Prior Publication Data

US 2004/0056665 A1 Mar. 25, 2004

(30) Foreign Application Priority Data

Sep. 24, 2002 (JP) ........................................ 2002-278113

(51) Int. Cl.[7] .............................................. G08B 17/00
(52) U.S. Cl. ...................... 340/660; 340/635; 340/663; 361/1
(58) Field of Search ................................ 340/660, 657, 340/635, 663, 664; 361/1, 90, 91.3, 92

(56) References Cited

U.S. PATENT DOCUMENTS

| 6,355,915 B1 | * | 3/2002 | Ziaimehr et al. | ............ 219/486 |
| 6,396,562 B1 | | 5/2002 | Iwanaga | ...................... 355/30 |
| 2002/0006675 A1 | | 1/2002 | Shigaraki | ...................... 438/4 |

FOREIGN PATENT DOCUMENTS

JP  6-19520  1/1994

* cited by examiner

Primary Examiner—Julie Bichngoc Lieu
(74) Attorney, Agent, or Firm—Fitzpatrick, Cella, Harper & Scinto

(57) ABSTRACT

A power monitoring apparatus monitors the voltage fluctuation range of an AC power supply and the duration of voltage fluctuations within the voltage fluctuation range. The power monitoring apparatus looks up a power failure rank table for determining the power failure rank of the power supply on the basis of the voltage fluctuation range and the duration obtained as the monitoring result to determine the power failure rank of the power supply. The power monitoring apparatus sends a power failure signal indicating the power failure rank to a power supply destination of an AC power supply.

17 Claims, 10 Drawing Sheets

POWER MONITORING UNIT, CONTROL METHOD THEREFOR, AND EXPOSURE APPARATUS

FIELD OF THE INVENTION

The present invention relates to a power monitoring unit which monitors a power failure, a control method therefor, and an exposure apparatus which has the power monitoring unit and projects a pattern on the first substrate onto the second substrate and exposes the second substrate to the pattern, using a projection optical system.

BACKGROUND OF THE INVENTION

Generally, a semiconductor manufacturing device, more particularly a reduction projection exposure apparatus called a stepper is arranged to include driving apparatuses which control to drive respective actuators and a control operation section which generates control commands for the actuators on the basis of numerical information to output them to the driving apparatuses. In such an exposure apparatus, an input power failure in the apparatus power supply voltage due to an instantaneous power interruption or momentary voltage fluctuations called a sag may cause loss of important data, abnormal control operation, abnormal operation of an actuator, or the like.

Conventionally, as a solution to such an input power failure, a method of protecting the entire apparatus with an uninterruptible power supply or a method of incorporating an uninterruptible power supply in the apparatus, thereby issuing a save command or operation stop command to each actuator in accordance with a power supply voltage abnormality time and storing data required to actuate the apparatus again upon recovery has been proposed (e.g., see Japanese Patent Laid-Open No. 6-19520).

Along with recent miniaturization of a semiconductor and an increase in wafer size, an exposure apparatus has been upsized and at the same time has been required to operate at high speed. Additionally, the power consumption of an exposure apparatus has been increasing. For this reason, an uninterruptible power supply to be incorporated in an exposure apparatus in preparation for a power failure need be larger. This causes an increase in footprint and price of the apparatus.

Most recent DC power supplies are switching power supplies. A switching power supply theoretically stands power supply variations, and in many cases, a voltage drop of several ten % does not require backup by an interruptible power supply. Collective backup of a power supply section including such a switching power supply by an uninterruptible power supply is undesirable because it may cause an unnecessary increase in size of the uninterruptible power supply. Since an uninterruptible power supply uses a battery, it needs periodical replacement and may cause an accident such as ignition due to excessive charge and discharge. For this reason, it is preferable not to use an uninterruptible power supply if possible. Even if an uninterruptible power supply is to be used, a small one having a small amount of stored energy is preferably selected.

SUMMARY OF THE INVENTION

The present invention has been made to solve the above-mentioned problems, and has as its object to provide a power monitoring unit capable of notifying a power supply destination of appropriate information on its operation to cause the power supply destination to efficiently operate, a control method therefor, and an exposure apparatus capable of efficiently operating by utilizing the power monitoring unit.

According to the present invention, the foregoing object is attained by a power monitoring apparatus which monitors a power supply for failures, comprising:

monitoring means for monitoring a voltage fluctuation range of the power supply and a duration of voltage fluctuations within the voltage fluctuation range;

determination means for looking up a power failure rank table for determining a power failure rank of the power supply on the basis of the voltage fluctuation range and the duration obtained as a monitoring result from the monitoring means to determine the power failure rank of the power supply; and output means for outputting a power failure signal indicating the power failure rank determined by the determination means to a power supply destination of the power supply.

In a preferred embodiment, the power failure rank comprises a rank defined by a predetermined voltage fluctuation range and a duration of voltage fluctuations within the predetermined voltage fluctuation range or a plurality of ranks defined by a plurality of different voltage fluctuation ranges and fluctuation durations.

In a preferred embodiment, the apparatus further comprises storage means for storing the power failure rank table.

According to the present invention, the foregoing object is attained by an exposure apparatus which has a power monitoring apparatus which monitors a power supply for failures and projects a pattern on a first substrate onto a second substrate to expose the second substrate to the pattern using a projection optical system, wherein the power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply, and the exposure apparatus comprises control means for controlling operation of units constituting the exposure apparatus on the basis of the power failure rank indicated by the power failure signal output from the power monitoring apparatus.

In a preferred embodiment, the control means performs any of operation of allowing the units to continue to operate, preparation for stopping operation, stop operation which allows resumption of operation upon recovery from a power failure, and stop operation which prohibits the resumption of operation without any intervention upon recovery from a power failure, and restarts operation in accordance with stop state upon recovery from a power failure.

In a preferred embodiment, the control means uses a profile for controlling operation of the units constituting the exposure apparatus to control the units.

In a preferred embodiment, the control means switches from the profile to a power failure profile on the basis of a power failure signal output from the power monitoring apparatus and uses the power failure profile to control the units.

In a preferred embodiment, one of the units constituting the exposure apparatus comprises an actuator, and the control means performs stop operation by switching from a profile of the actuator in operation to a stop profile, stop operation at a point in time when acceleration of the actuator becomes zero, or stop operation without servo control on the basis of a power failure signal output from the power monitoring apparatus and restarts exposure operation upon recovery from a power failure.

According to the present invention, the foregoing object is attained by providing an exposure apparatus which has a plurality of power monitoring apparatuses which monitor a power supply for failures and projects a pattern on a first substrate onto a second substrate to expose the second substrate to the pattern using a projection optical system, wherein units constituting the exposure apparatus are divided into unit groups, and each of the plurality of power monitoring apparatuses monitors power supply state of each unit group, each power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply, and the exposure apparatus comprises control means for controlling operation of the unit groups on the basis of the power failure rank indicated by power failure signals output from the plurality of power monitoring apparatuses.

In a preferred embodiment, the control means performs for each unit group any of operation of allowing the units in each unit group to continue to operate, preparation for stopping operation, stop operation which allows resumption of operation upon recovery from a power failure, and stop operation which prohibits the resumption of operation without any intervention upon recovery from a power failure, and restarts operation in accordance with stop state upon recovery from a power failure.

In a preferred embodiment, the control means uses a profile for controlling operation of the units constituting the exposure apparatus to control the units.

In a preferred embodiment, the control means switches from the profile to a power failure profile on the basis of a power failure signal output from the power monitoring apparatus and uses the power failure profile to control the units.

In a preferred embodiment, one of the units constituting the exposure apparatus comprises an actuator, and the control means performs stop operation by switching from a profile of the actuator in operation to a stop profile, stop operation at a point in time when acceleration of the actuator becomes zero, or stop operation without servo control on the basis of a power failure signal output from the power monitoring apparatus and restarts exposure operation upon recovery from a power failure.

According to the present invention, the foregoing object is attained by providing a semiconductor device manufacturing method of manufacturing a semiconductor device using an exposure apparatus which projects a pattern on a first substrate onto a second substrate to expose the second substrate to the pattern using a projection optical system, comprising:

an application step of applying a photosensitive agent to the second substrate;

an exposing step of exposing the second substrate by the exposure apparatus; and a development step of developing the exposed second substrate, wherein the exposure apparatus comprises a power monitoring apparatus which monitors a power supply for failures and control means for controlling operation of units constituting the exposure apparatus on the basis of a power failure rank indicated by a power failure signal output from the power monitoring apparatus, and the power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply.

According to the present invention, the foregoing object is attained by providing a semiconductor device manufacturing method of manufacturing a semiconductor device using an exposure apparatus which projects a pattern on a first substrate onto a second substrate to expose the second substrate to the pattern using a projection optical system, comprising:

an application step of applying a photosensitive agent to the second substrate;

an exposing step of exposing the second substrate by the exposure apparatus; and a development step of developing the exposed second substrate, wherein the exposure apparatus comprises a plurality of power monitoring apparatuses which monitor a power supply for failures and control means for controlling operation of unit groups into which units constituting the exposure apparatus are divided, on the basis of a power failure rank indicated by a power failure signal output from each of the plurality of power monitoring apparatuses, each of the plurality of power monitoring apparatuses monitors power supply state of each unit group, and each power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply.

According to the present invention, the foregoing object is attained by providing a method of controlling a power monitoring apparatus which monitors a power supply for failures, comprising:

a monitoring step of monitoring a voltage fluctuation range of the power supply and a duration of voltage fluctuations within the voltage fluctuation range, a determination step of looking up a power failure rank table for determining a power failure rank of the power supply on the basis of the voltage fluctuation range and the duration obtained as a monitoring result in the monitoring step to determine the power failure rank of the power supply, and an output step of outputting a power failure signal indicating the power failure rank determined in the determination step to a power supply destination of the power supply.

According to the present invention, the foregoing object is attained by providing a program for controlling a power monitoring apparatus which monitors a power supply for failures, comprising:

a program code for a monitoring step of monitoring a voltage fluctuation range of the power supply and a duration of voltage fluctuations within the voltage fluctuation range, a program code for a determination step of looking up a power failure rank table for determining a power failure rank of the power supply on the basis of the voltage fluctuation range and the duration obtained as a monitoring result in the monitoring step to determine the power failure rank of the power supply, and a program code for an output step of outputting a power failure signal indicating the power failure rank determined in the determination step to a power supply destination of the power supply.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Embodiments of the present invention will be described below in detail with reference to the accompanying drawings.

(First Embodiment)

Figure 1:
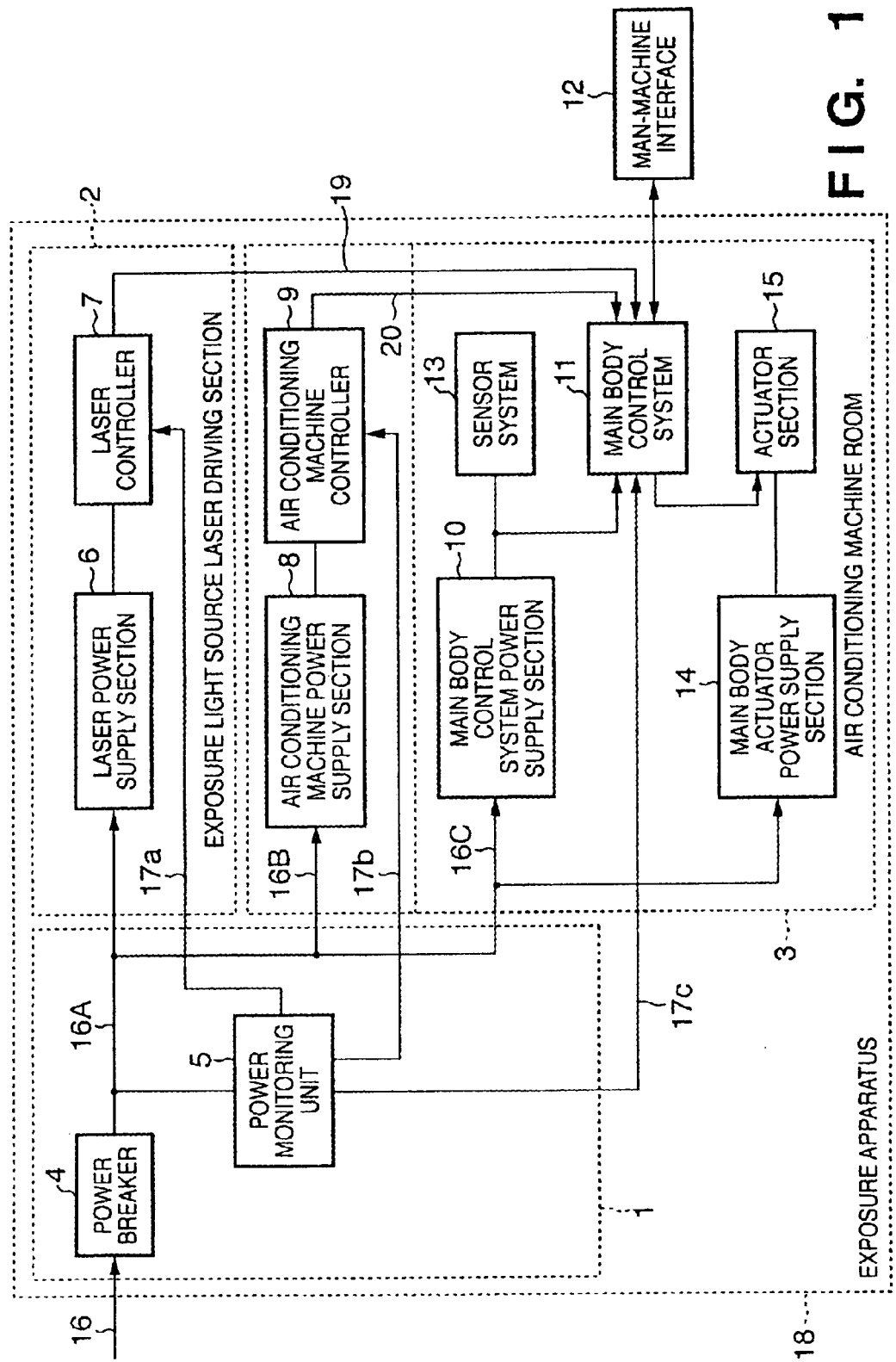
FIG. 1 is a diagram showing the schematic arrangement of a semiconductor exposure apparatus according to the first embodiment of the present invention.

FIG. 1 is a diagram showing the schematic arrangement of a semiconductor exposure apparatus according to the first embodiment of the present invention.

In FIG. 1, a semiconductor exposure apparatus 18 (to be simply referred to as the exposure apparatus 18 hereinafter) is powered by an AC power supply 16. A power supply section 1 outputs input power as power outputs 16A to 16C through a power breaker 4 to distribute them to units in the exposure apparatus 18 as power supply destinations. The power supply section 1 has a power monitoring unit 5, which constantly monitors the power supply state of the AC power supply 16.

The exposure apparatus 18 comprises an exposure light source laser driving section 2 and an air conditioning machine room 3 which includes the main body of the exposure apparatus 18. The exposure light source laser driving section 2 comprises a laser power supply section 6 and a laser controller 7. The air conditioning machine room 3 comprises an air conditioning machine power supply section 8, an air conditioning machine controller 9, a main body control system power supply section 10, a main body control system 11, a man-machine interface section 12, a sensor system 13, a main body actuator power supply section 14, and an actuator section 15.

The laser power supply section 6, the air conditioning machine power supply section 8, and the main body control system power supply section 10 and main body actuator power supply section 14 receive the power outputs 16A to 16C, respectively. On the basis of the power supply state of the AC power supply 16, power failure signals 17a, 17b, and 17c are input from the power monitoring unit 5 to the laser controller 7, air conditioning machine controller 9, and main body control system 11, respectively.

Power failure ranks of the AC power supply 16 will be explained next with reference to FIG. 2. The power failure rank to which the AC power supply 16 belongs is determined on the basis of a result of monitoring the power supply state of the AC power supply 16 by the power monitoring unit 5 of the first embodiment.

Figure 2:
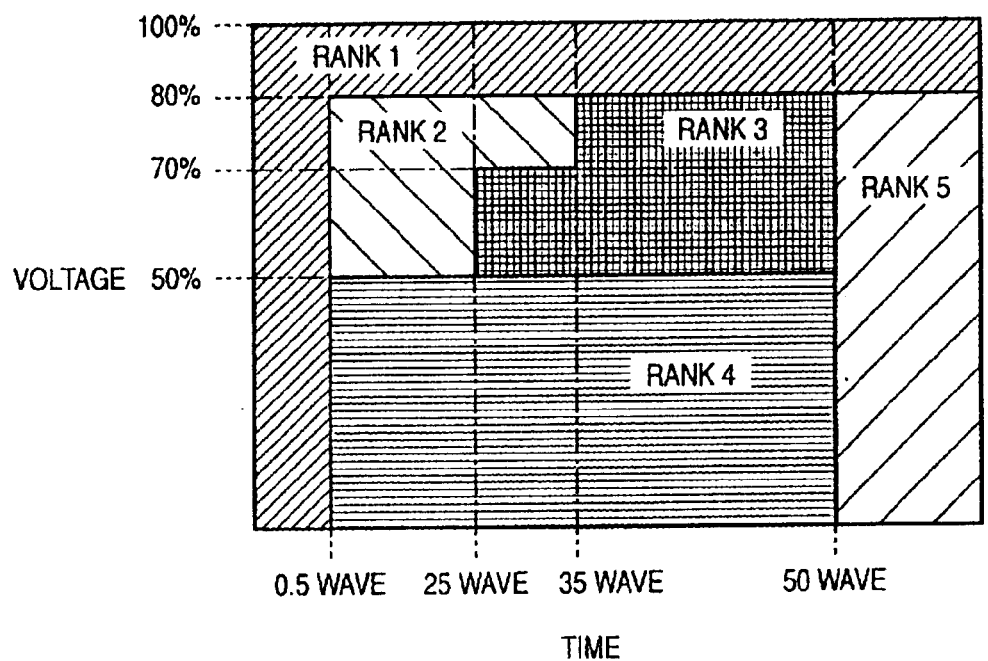
FIG. 2 is a chart showing an example of a power failure rank table which defines the types of power failure rank, according to the first embodiment of the present invention.

FIG. 2 is a chart showing an example of a power failure rank table which defines the types of power failure rank, according to the first embodiment of the present invention.

Referring to FIG. 2, the ordinate represents the voltage, and the normal voltage is defined as 100%. The abscissa represents the duration of the power supply voltage. The duration in FIG. 2 is represented by the number of waves of the input AC power of the AC power supply 16.

For example, for an AC 50-Hz voltage, 0.5 wave corresponds to 10 ms; 25 waves, 0.5 sec; 35 waves, 0.7 sec; and 50 waves, 1 sec. In the first embodiment, the power failure ranks include five ranks.

A combination of a region in which the abnormal voltage duration is less than 0.5 wave, and the voltage range spans 0% to 100%, and a region in which the voltage range is 80% or more belongs to rank 1.

A combination of a region in which the abnormal voltage duration ranges from 0.5 wave to less than 25 waves, and the voltage range spans 50% or more to 80% or less, and a region in which the abnormal voltage duration ranges from 25 waves to less than 35 waves, and the voltage range spans 70% to 80% or less belongs to rank 2.

A combination of a region in which the abnormal voltage duration ranges from 25 waves to less than 35 waves, and the voltage range spans 50% to 70% or less, and a region in which the abnormal voltage duration ranges from 35 waves to less than 50 waves, and the voltage range spans 50% to 80% or less belongs to rank 3.

A region in which the abnormal voltage duration ranges from 0.5 wave to less than 50 waves, and the voltage range is 50% or less belongs to rank 4.

A region in which the abnormal voltage duration is 50 waves or more, and the voltage range is 80% or less belongs to rank 5.

In FIG. 1, each of the power failure signals 17a, 17b, and 17c to be output from the power monitoring unit 5 includes information indicating any one of the first to fifth ranks. Although in the first embodiment, ranking is determined only for a region whose voltage range is 100% or less, it may also be determined for a region whose voltage range is 100% or more in the same manner. The operation of the sections of the exposure apparatus when a power failure occurs will be described below for each rank.

If the exposure light source laser driving section 2 receives the power failure signal 17a indicating rank 1 from the power monitoring unit 5, it operates normally without any trouble.

If the power failure signal 17a indicates rank 2, the wavelength stability or energy may be insufficient to satisfy specifications, depending on the required exposure energy or the degree of deterioration of gas. For this reason, if check of the internal state of an exposure laser indicates a problem with light emission, the exposure light source laser driving section 2 sends a laser unstable signal 19 as an error signal to the main body control system 11.

Upon reception of the signal, the main body control system 11 stores the exposure shots in case of the laser unstable state, and notifies the operator of the unstable state through the man-machine interface section 12.

If the power failure signal 17a indicates rank 3, the exposure light source laser driving section 2 cannot emit exposure laser light and remains the light emission standby state. The exposure light source laser driving section 2 is ready for light emission immediately after the laser power supply section 6 recovers.

If the power failure signal 17b indicates rank 4 or 5, the exposure light source laser driving section 2 cannot maintain the light emission standby state and stops. In this case, even when the AC power supply 16 recovers, the exposure light source laser driving section 2 cannot emit exposure laser light immediately and needs to be reinitialized.

If the air conditioning machine room 3 receives the power failure signal 17b indicating rank 1 from the power monitoring unit 5, the air conditioning machine operates normally without any trouble.

Assume that the power failure signal 17b indicates rank 2 or 3. In this case, since the air conditioning machine room 3 uses a refrigerator pump and an air blower which require a large amount of electric power, it cannot continue operation necessary for air conditioning. However, this rank does not lead to a system down, and operation in the air conditioning machine room 3 continues. If a change in temperature in the air conditioning machine room 3 or the like may affect the performance of the exposure apparatus 18, the air conditioning machine controller 9 sends an air conditioning machine unstable signal 20 as an error signal to the main body control system 11, as in the case of the exposure light source laser driving section 2. Then, the main body control system 11 notifies the operator of the unstable state through the man-machine interface section 12.

If the power failure signal 17b indicates rank 4, operation in the air conditioning machine room 3 cannot continue and stops. Operation in the air conditioning machine room 3 automatically restarts immediately after the AC power supply 16 recovers.

If the power failure signal 17b indicates rank 5, operation in the air conditioning machine room 3 stops, similarly to rank 4. In this case, even when the AC power supply 16 recovers, operation in the air conditioning machine room 3 does not automatically restart.

Upon receiving the power failure signal 17c from the power monitoring unit 5, the main body control system 11 performs appropriate processing for the actuator section 15. The main body control system power supply section 10 (AC/DC power supply section or DC/DC power supply section) comprises a switching power supply, and the main body control system 11 consumes power one order of magnitude lower than those of the exposure light source laser driving section 2 and air conditioning machine room 3. For this reason, if the power failure signal 17c indicates rank 1, 2, or 3, the main body control system 11 operates normally.

In the case of rank 2 or 3, an error signal (the laser unstable signal 19 or air conditioning machine unstable signal 20) may be sent from the exposure light source laser driving section 2 or air conditioning machine controller 9, as described above. In this case, the main body control system 11 performs processing such as message issuance or stops the operation of the actuator section 15 if the actuator section 15 cannot ensure operation in the rank 3 state, depending on the contents of the error signal.

Assume that the power failure signal 17c indicates rank 4. The main body control system 11 cannot operate normally if an abnormal voltage further continues. Accordingly, the main body control system 11 holds the internal state and necessary parameters and stops operation. In this case, the main body control system 11 can return to normal operation upon the recovery of the AC power supply 16.

If the power failure signal 17c indicates rank 5, the main body control system 11 shifts to shutdown. Even if the AC power supply 16 recovers, the main body control system 11 cannot operate normally without reinitialization. As described above, since the main body control system 11 consumes low power, charges accumulated in a capacitor of the switching power supply can cover the parameter holding operation or shutdown operation. A small uninterruptible power supply may be arranged in the exposure apparatus 18, as needed.

Likewise, the actuator section 15 continues normal operation if the power failure signal 17c indicates rank 1 or 2.

If the power failure signal 17c indicates rank 3 or 4, stable stop operation is performed in synchronism with the main body control system 11 to stably stop the apparatus. Since the apparatus has already stopped, a transition of the rank of the power failure signal 17c to rank 5 causes no problem.

The operation of the power monitoring unit 5 will be described next.

Figure 3:
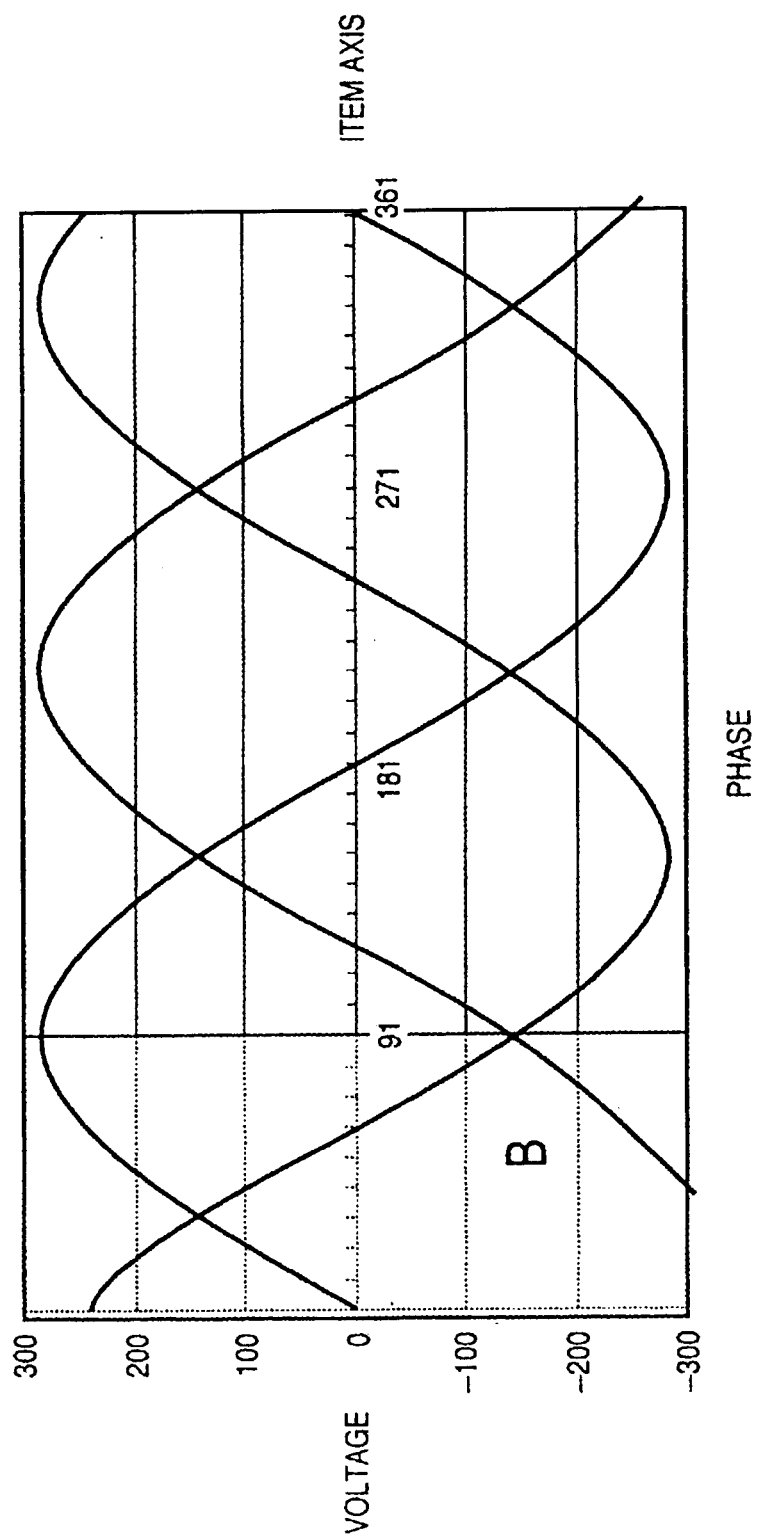
FIG. 3 is a graph showing a change in three-phase AC voltage according to the first embodiment of the present invention.

FIG. 3 is a graph showing a change in three-phase AC voltage according to the first embodiment of the present invention.

FIG. 3 shows the three-phase AC voltage of 200V. The ordinate represents the voltage; and the abscissa, the time. The power monitoring unit 5 constantly calculates the power of a region B in FIG. 3, i.e., a half-wave portion. The power monitoring unit 5 determines the power failure rank of the power supply state on the basis of the calculation result.

The calculation is performed in electric power because this needs no phase information, need not detect the zero crossing timing, can easily process data near zero, stands noise and frequency variations, and the like. If the processing system has sufficient ability, the calculation may be performed in voltage. In this case, the phase, frequency, and the like need to be measured, in addition to the voltage.

The operation executed by the power monitoring unit 5 will be described with reference to FIG. 4.

Figure 4:
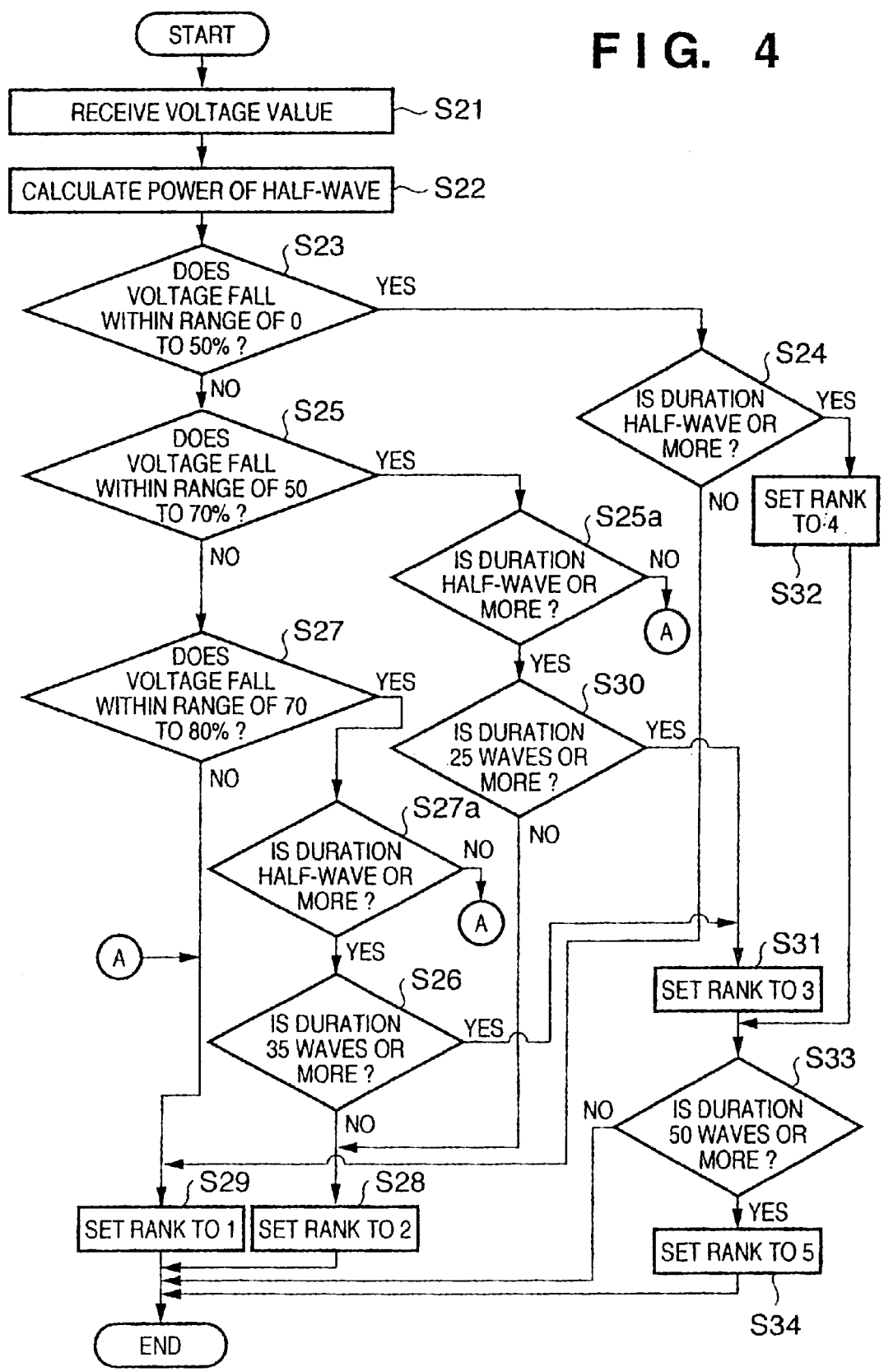
FIG. 4 is a flow chart showing the operation executed by a power monitoring unit according to the first embodiment of the present invention.

FIG. 4 is a flow chart showing the operation executed by the power monitoring unit according to the first embodiment of the present invention.

In step S21, a voltage value at each phase of FIG. 3 is sampled. It suffices that the sampling interval corresponds to about ten times the frequency. The following operation is executed for each sample. More specifically, the power failure rank of the AC power supply 16 is determined by looking up the power failure rank table of FIG. 2 on the basis of the voltage fluctuation range of the AC power supply 16 and voltage fluctuations within the voltage fluctuation range.

In step S22, the power of a half-wave portion is calculated.

In step S23, it is determined whether the power value as the calculation result is less than 50% in terms of rms value of voltage. If the power value is less than 50% (YES in step S23), the flow advances to step S24 to determine whether the duration is a half-wave or more. If the duration is a half-wave or more (YES in step S24), the flow advances to step S32. In step S32, the power failure rank is set to rank 4, and the flow advances to step S33. If the duration is less than a half-wave (NO in step S24), the flow advances to step S29. In step S29, the power failure rank is set to rank 1, and the process ends.

On the other hand, if it is determined in step S23 that the power value is 50% or more (NO in step S23), the flow advances to step S25 to determine whether the power value falls within the range of 50% or more to less than 70% in terms of rms value of voltage. If the power value falls within the range of 50% or more to less than 70% (YES in step S25), the flow advances to step S25a to determine whether the duration is a half-wave or more. If the duration is less than a half-wave (NO in step S25a), the flow advances to step S29 to set the power failure rank to rank 1; otherwise (YES in step S25a), the flow advances to step S30.

In step S30, it is determined whether the duration is 25 waves or more. If the duration is 25 waves or more (YES in step S30), the flow advances to step S31. In step S31, the power failure rank is set to rank 3, and the flow advances to step S33. If the duration is less than 25 waves (NO in step S30), the flow advances to step S28. In step S28, the power failure rank is set to rank 2, and the process ends.

On the other hand, if it is determined in step S25 that the power value is 70% or more (NO in step S25), the flow advances to step S27 to determine whether the power value falls within the range of 70% or more to less than 80% in terms of rms value of voltage. If the power value falls within the range of 70% or more to less than 80% (YES in step S27), the flow advances to step S27a to determine whether the duration is a half-wave or more. If the duration is less than a half-wave (NO in step S27a), the flow advances to step S29 to set the power failure rank to rank 1; otherwise (YES in step S27a), the flow advances to step S26.

In step S26, it is determined whether the duration is 35 waves or more. If the duration is 35 waves or more (YES in step S26), the flow advances to step S31. In step S31, the power failure rank is set to rank 3, and the flow advances to step S33. If the duration is less than 35 waves (NO in step S26), the flow advances to step S28. In step S28, the power failure rank is set to rank 2, and the process ends.

In step S33, it is determined whether the duration of rank 3 or 4 is 50 waves or more. If the duration is 50 waves or more (YES in step S33), the power failure rank is set again to rank 5, and the process ends. If the duration is less than 50 waves, the process ends without changing the power failure rank.

By repeating the above-mentioned processing for each sampling, the power failure rank can be determined on the basis of the power failure rank table of FIG. 2 in consideration of the voltage fluctuation range and the duration of voltage fluctuations within the voltage fluctuation range. The rank set by this processing is output to the output destinations as the power failure signals 17a to 17c.

The internal arrangement of the power monitoring unit 5 will be described with reference to FIG. 5.

Figure 5:
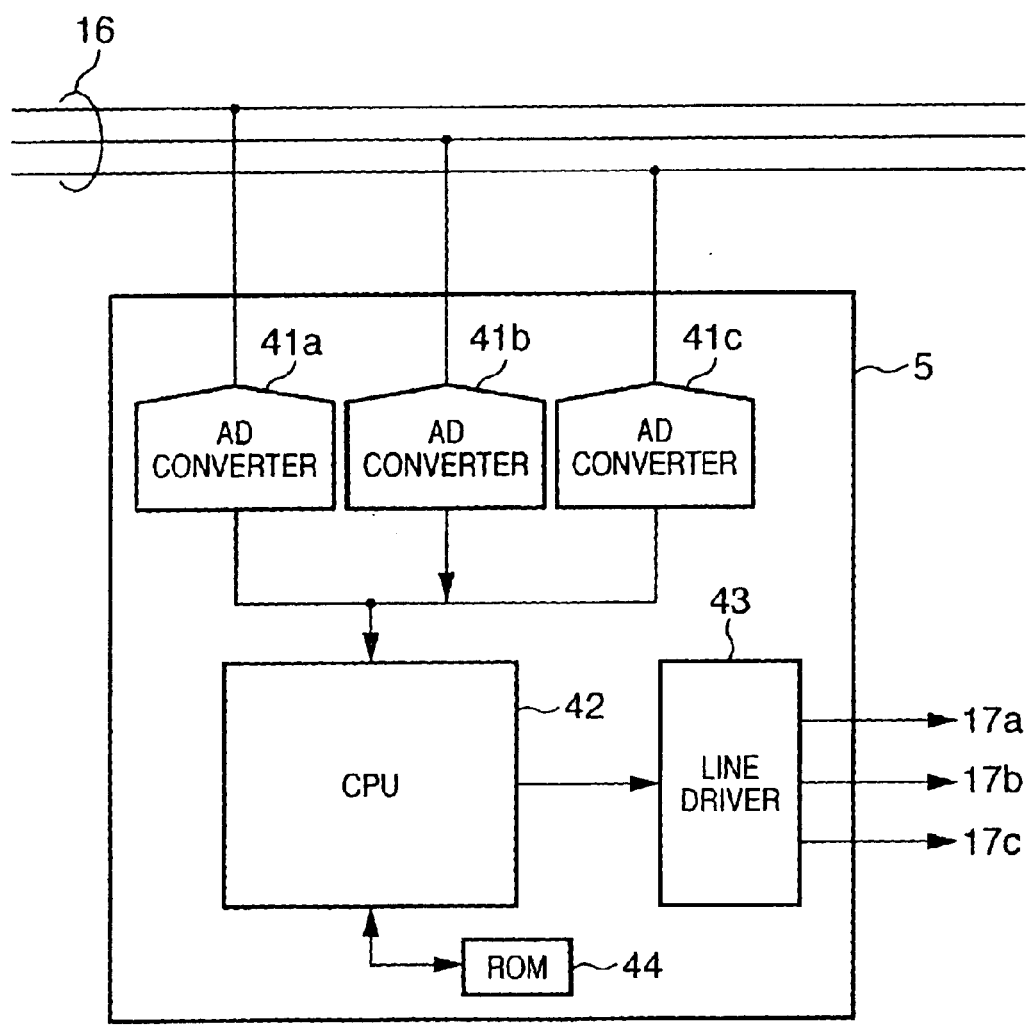
FIG. 5 is a block diagram showing the internal arrangement of the power monitoring unit according to the first embodiment of the present invention.

FIG. 5 is a block diagram showing the internal arrangement of the power monitoring unit according to the first embodiment of the present invention.

AD converters 41a to 41c which correspond to the three phases of the AC power supply 16, respectively, A/D-convert a voltage value for each sampling. A CPU 42 determines the power failure rank for A/D-converted data in accordance with the flow chart of FIG. 4. Software for determining the power failure rank and the power failure rank table of FIG. 2 used to implement the process of the flow chart of FIG. 4 executed by the CPU 42 are stored in a ROM 44. Any storage medium such as an EEPROM may be employed instead of the ROM 44 as far as its data can be overwritten, and its memory contents can be saved even if the power is shut down.

The CPU 42 executes the above-mentioned process of FIG. 4 by reading and executing the software for determining the power failure rank from the ROM 44. Since the software for determining the power failure rank and power failure rank table are stored in the ROM 44, the power failure rank can be changed or the processing contents of the software for determining the power failure rank can be changed, with only replacement of the ROM 44 with a new one.

The CPU 42 outputs the determination result of the power failure rank as the power failure signals 17a, 17b, and 17c to the units (the laser controller 7, air conditioning machine controller 9, and main body control system 11) as the power supply destinations, respectively, through a line driver 43. Sampling in the AD converters 41a, 41b, and 41c is preferably performed simultaneously. However, there may be a sampling shift between the converters as far as it is smaller than 1/100 the power supply frequency.

Figure 6:
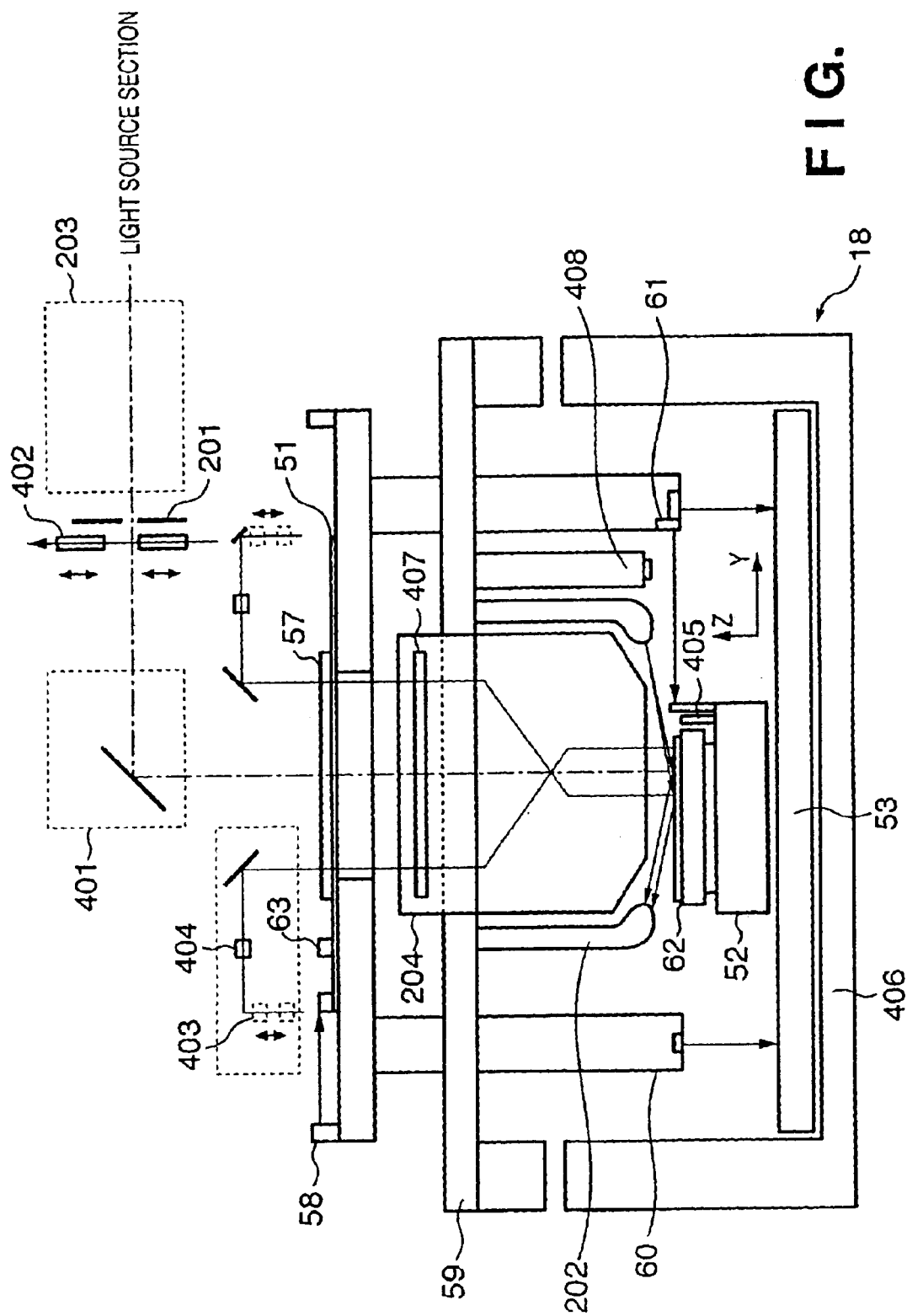
FIG. 6 is a view showing the major arrangement of the semiconductor exposure apparatus according to the first embodiment of the present invention.

The functions and operation of the main parts of the exposure apparatus 18 will be described with reference to FIG. 6. In FIG. 6, a scanning exposure apparatus which synchronously scans a reticle and a wafer will be exemplified.

FIG. 6 is a view showing the major arrangement of the exposure apparatus according to the first embodiment of the present invention.

Exposure light from the excimer laser light source 2 reaches a slit 201 through a first condenser lens 203. The slit 201 can narrow a light beam of the exposure light to a sheet-like beam having a dimension of, e.g., about 7 mm in the Z direction and can adjust the illuminance integrated in the Z-axis direction so as to be uniform at coordinates on an axis (X-axis) perpendicular to the sheet surface of FIG. 6.

A masking blade 402 follows the end of the pattern drawing field angle of a reticle 57 serving as the first substrate in scanning exposure for a reticle stage 51 and a wafer stage 52. The masking blade 402 prevents exposure light from striking a portion which is not shielded from light by the reticle 57 and being projected on a wafer 62 serving as the second substrate while the reticle stage 51 decelerates after passing through the pattern area of the reticle 57.

Exposure light having passed through the masking blade 402 illuminates the reticle 57 on the reticle stage 51 through a second condenser lens group 401. The exposure light having passed through the pattern of the reticle 57 forms the imaging plane of the reticle pattern near the surface of the wafer 62 through a projection lens 204.

An NA stop 407 is arranged in the projection lens to change the aperture state in accordance with a change in illumination mode in exposure. One-dimensionally movable TTL scopes 404 measure the X-, Y-, and Z-axis positions of an alignment mark on the reticle 57, those of an alignment mark formed on the wafer 62, and those of an alignment mark formed on a wafer reference plate 405 with respect to the absolute position reference of each TTL scope 404.

Reference numeral 403 denotes relay lenses, each for adjusting the focus of the TTL scope 404. By referring to the position of the relay lens 403 when the alignment mark is in best focus, the position in the focus (Z) direction of an object to be detected can be measured.

In FIG. 6, two TTL scopes 404 are arranged at different positions in the Y direction. In practice, still another TTL scope is arranged in the X direction. This arrangement enables measuring tilts in the $\omega x$ and $\omega y$ directions using the alignment mark on the reticle 57, wafer 62, or wafer reference plate 405. The TTL scope 404 shown in FIG. 6 can be driven toward the center of the field angle, i.e., in the Y direction.

The reticle stage 51 is controlled in the X, Y, and $\theta$ directions by three reticle laser interferometers 58. FIG. 6 shows only one reticle laser interferometer 58 for illustrative convenience. In practice, however, two reticle laser interferometers 58 and one reticle laser interferometer 58 are respectively arranged in the Y direction and in a direction perpendicular to the sheet surface of FIG. 6. The reticle stage 51 is movable in the X, Y, and $\theta$ directions along a guide arranged on a lens barrel surface plate 59. The reticle stage 51 can move over a long stroke in the Y-axis direction for scanning in synchronism with the wafer stage 52. The reticle stage 51 moves in the X- and $\theta$-axis directions in fine driving to eliminate an error generated when the reticle stage 51 chucks the reticle 57. The exposure apparatus has a structure which escapes a reaction force generated upon reticle driving to a reaction force absorption device (not shown) rigidly connected to a base plate 406. The lens barrel surface plate 59 does not shake in reaction to driving.

A reticle reference plate 63 on which a mark observable with the TTL scope 404 is drawn is mounted on the reticle stage 51. A focus detector 202 is used for focus measurement of the wafer 62 in exposure while the reticle stage 51 and wafer stage 52 are synchronously scanned.

The focus detector 202 measures the Z, $\omega x$, and $\omega y$ positions of the wafer 62 or wafer reference plate 405 on the wafer stage 52 at high speed regardless of the presence/absence of the alignment mark without the mediacy of the projection lens 204.

To guarantee the long-term stability of the measurement precision, the focus detector 202 performs self calibration by comparing the result of measuring the wafer reference plate 405 on the wafer stage 52 by the TTL scope 404 with the result of measuring the wafer reference plate 405 by the focus detector 202.

A single-lens off-axis scope 408 has a focus measurement function and an X/Y-direction alignment error measurement function. To align the wafer 62 in a general mass production job, the off-axis scope 408 performs global tilt measurement and global alignment measurement.

The global tilt correction and global alignment correction are simultaneously performed when the wafer stage 52 is so stepped as to position the exposure area of the wafer 62 below the projection lens 204.

The lens barrel surface plate 59 serves as a base for attaching the high-precision measurement device of the exposure apparatus 18. The lens barrel surface plate 59 is positioned to slightly float above the base plate 406 directly set on the floor. Since the above-described focus detector 202 and TTL scope 404 are attached to the lens barrel surface plate 59, the measurement values of these measurement devices eventually represent the relative distances from the lens barrel surface plate 59.

An inter-surface-plate laser interferometer 60 measures the positions of the lens barrel surface plate 59 and a stage surface plate 53 relative to each other. Similar to the reticle laser interferometers 58, three wafer stage interferometers 61 are arranged and used to control the wafer stage 52 in the X, Y, and $\theta$ directions.

The stage surface plate 53 is positioned to slightly float from the base plate 406, similar to the lens barrel surface plate 59. The stage surface plate 53 has a function of removing vibrations transmitted from the floor to the wafer stage 52 through the base plate 406, and a function of absorbing a reaction force upon driving the wafer stage 52 and escaping the reaction force to the base plate 406. The wafer stage 52 is mounted above the stage surface plate 53 by slightly floating from it.

A control operation unit which controls the operation of the units constituting the exposure apparatus 18, e.g., a control operation unit which controls the wafer stage 52 will be described with reference to FIG. 7.

Figure 7:
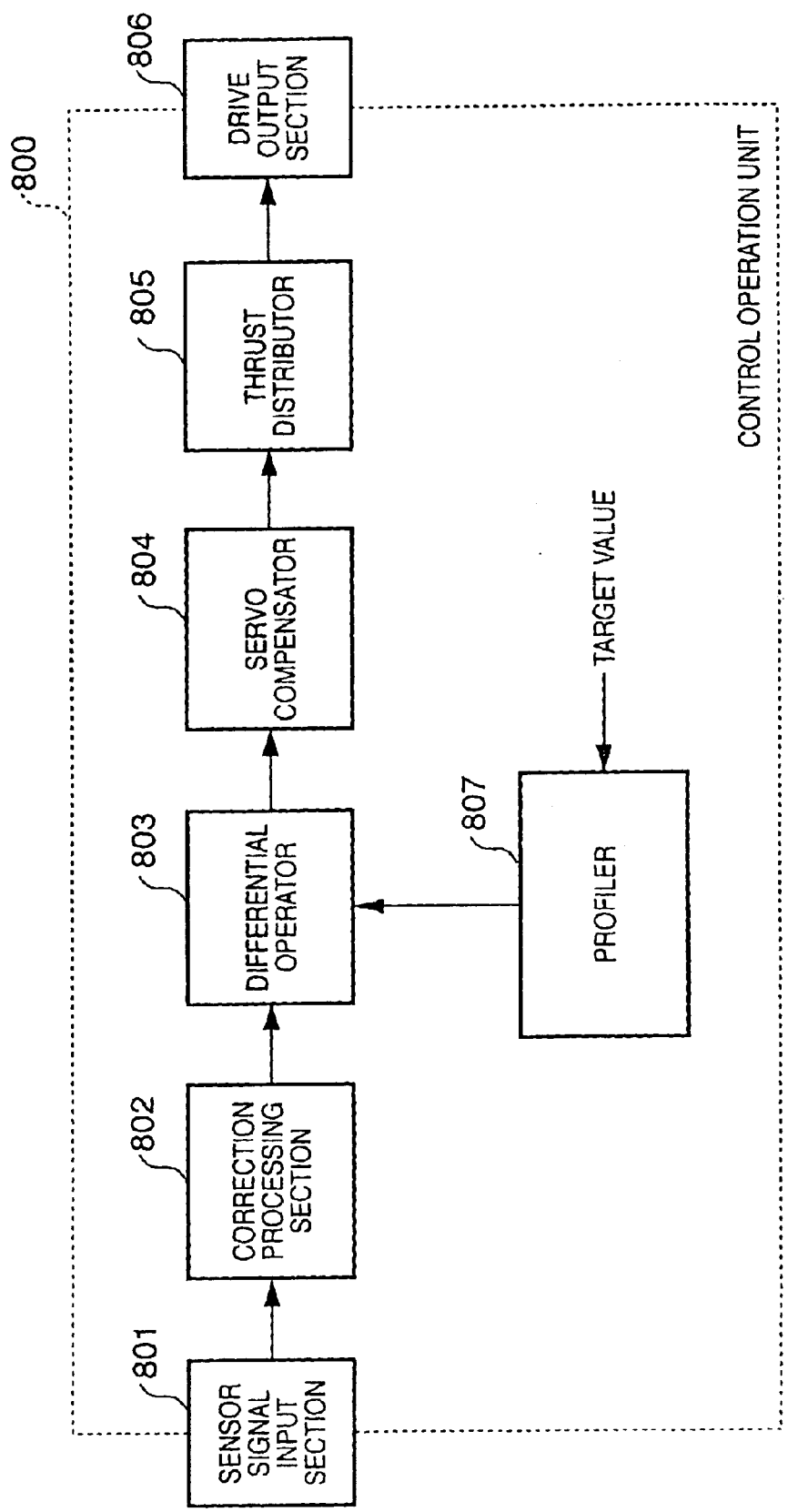
FIG. 7 is a block diagram showing a control operation unit according to the first embodiment of the present invention.

FIG. 7 is a block diagram showing a control operation unit according to the first embodiment of the present invention.

In a control operation unit 800, a sensor signal input section 801 receives signals output from the wafer stage interferometers 61 and inter-surface-plate laser interferometer 60. The received output signals are passed to a correction processing section 802 and undergo correction processing, thereby obtaining data indicating the current position along each axis.

A profiler 807 performs movement control operation for the wafer stage 52 on the basis of a set profile out of a plurality of profiles while gradually changing a control target value in accordance with a stepwise change in target value designated by the host sequence so as not to apply an acceleration of more than a specified value to the wafer stage 52.

The profiler 807 switches from a currently set profile of a unit as a control target (in this case, the wafer stage 52) to a power failure profile (in this case, a stage stop profile or power shutdown profile to be described later). The profiler 807 controls the operation of the unit as the control target on the basis of the power failure profile in subsequent processing.

A differential operator 803 compares an output from the profiler 807 and that from the correction processing section 802 to calculate a deviation from the sequentially changing target value. A servo compensator 804 comprises a compensator which is designed with consideration for the mechanical characteristics of the wafer stage 52, e.g., a PID controller and a notch filter function.

Controlled variables having passed through the servo compensator 804 are divided by a thrust distributor 805 into manipulated variables for actually arranged actuators of the wafer stage 52 and output from a drive output section 806.

The control operation unit for controlling the wafer stage 52 has been described above. A control operation unit for controlling the reticle stage 51 has the same arrangement.

The control operation unit 800 of FIG. 7 is arranged in the main body control system 11 of FIG. 1. A method of stably moving/stopping the stage upon reception of the power failure signal 17c from the power monitoring unit 5 will be described below.

If the power failure signal 17c indicates rank 1 or 2, the control operation unit 800 continues normal operation. In the case of rank 3, as described above, the main body actuator power supply section 14 cannot supply power sufficient for driving, and stage operation cannot be ensured. Accordingly, stable stop operation is started.

Upon reception of a determination result indicating rank 3 from the power failure signal 17c, the profiler 807 switches from the current profile to the stage stop profile, thereby stopping the wafer stage 52. In this case as well, the stage must be stopped while gradually changing the target value so as not to apply a rapid acceleration to the wafer stage 52 or not to cause a rapid change in force applied to the wafer stage 52. It is, however, difficult to make the stage stop profile support all cases. Under the circumstances, the stage stop profile is kept ready in advance during normal operation. Upon reception of the power failure signal 17c indicating rank 3, the profiler 807 switches from the current profile to the power shutdown profile.

If the load on the profiler 807 is too heavy to switch between profiles, the wafer stage 52 may be stopped after reaching a shot break at which the wafer stage 52 temporarily stops.

In this case, the main body actuator power supply section 14 needs a capacity sufficient to drive the wafer stage 52 to a shot break even when the power failure rank lowers to rank 3. Since the actuator section 15 consumes little power during stop of the wafer stage 52, the wafer stage 52 can stand by while being servo-controlled in a power failure of rank 3 or 4. For this reason, exposure can be restarted from the next shot upon recovery of the AC power supply 16.

An exposure shot upon occurrence of a power failure of rank 3 or 4 may be unsatisfactory. The host sequence must manage unsatisfactory shot information including the information of the unsatisfactory exposure shot. Alternatively, the wafer 62 being exposed upon occurrence of a power failure of rank 3 or 4 may be unloaded as a defective wafer outside the apparatus.

Upon reception of the power failure signal 17c indicating rank 3 or 4, the wafer stage 52 may be stopped by shorting a coil of a motor which drives the wafer stage 52 to perform regenerative braking, instead of switching between profiles by the profiler 807. In this case, the stopping distance becomes longer than that of the case of profile switching while the control operation unit 800 has a simpler arrangement.

Along with an increase in speed of a stage in recent years, the mechanical rigidity of a guide of the stage has been decreasing. For this reason, the number of so-called guideless stages is increasing these days. This guideless stage aligns a stage by electrical servo control instead of mechanical restraint. Regenerative braking may damage devices in such a guideless stage. For this reason, the stage is preferably stopped by a servo in the above-mentioned manner.

The stop operation of the wafer stage upon occurrence of a power failure and the resumption of operation have been described above. The present invention can be applied to all actuators which operate under servo control. The stop operation upon occurrence of a power failure and the resumption of operation can be performed by, e.g., applying the present invention to a wafer transfer system in the same manner.

As has been described above, according to the first embodiment, the power monitoring unit 5 determines the power failure rank of the AC power supply 16 from the fluctuation amount of the voltage of the AC power supply 16 and the duration of the fluctuations and controls units as power supply destinations of the AC power supply 16 on the basis of the determined power failure rank.

To perform this control, for example, preparation for stopping operation of the units, stop operation which allows the resumption of operation upon recovery from a power failure, or stop operation which prohibits the resumption of operation without any intervention upon recovery from a power failure is performed. Upon recovery from a power failure, operation can be restarted in accordance with the stop state. This can stably stop the apparatus upon occurrence of a power failure, and quickly restart operation, with a simple arrangement.

Upon reception of a power failure signal from the power monitoring unit 5, for example, stop operation by switching from a profile of the actuator section 15 in operation in the exposure apparatus 18 to a stop profile, stop operation at a point in time when the acceleration of the actuator section 15 becomes zero, or stop operation without servo control is performed. Upon recovery from a power failure, exposure operation is restarted, thereby enabling the apparatus to stably stop without damaging the units of the exposure apparatus 18.

(Second Embodiment)

Along with an increase in throughput of a recent exposure apparatus, the oscillation frequency of an exposure light source laser increases, a higher-speed stage consumes increasing power, and the need for a temperature control mechanism for preventing stage heat from affecting the exposure precision arises. This requires an excessive electric power.

In such an environment, if power is supplied from the single AC power supply 16 of the first embodiment, as shown in FIG. 1, to an exposure apparatus 18, a current capacity of 300 A or more is required, which is impractical. For this reason, as shown in FIG. 8, an arrangement in which power is supplied from a plant side separately to each unit will be described as the second embodiment.

Figure 8:
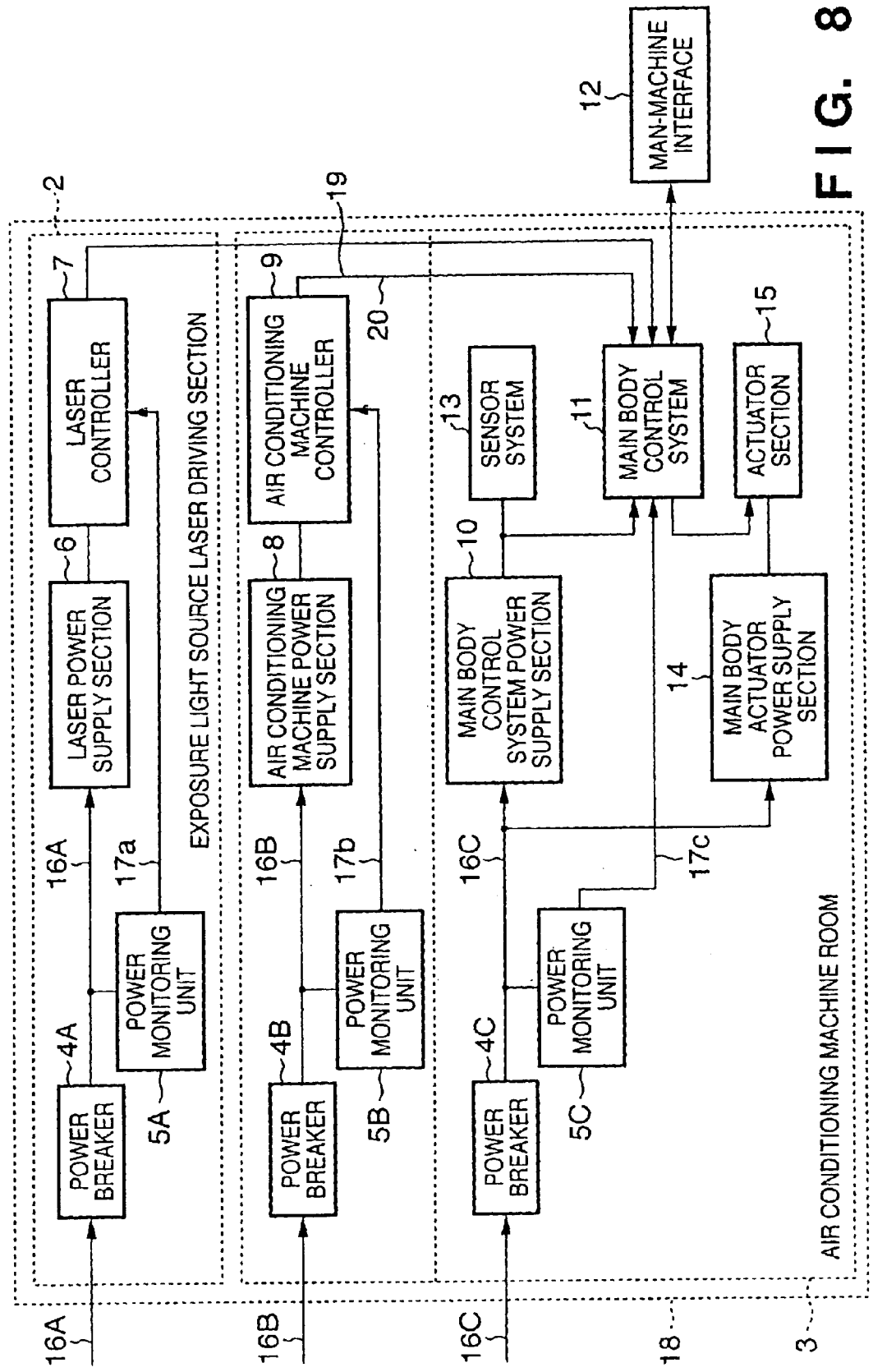
FIG. 8 is a view showing the schematic arrangement of a semiconductor exposure apparatus according to the second embodiment of the present invention.

FIG. 8 is a view showing the schematic arrangement of a semiconductor exposure apparatus according to the second embodiment of the present invention.

Referring to FIG. 8, power is supplied to the exposure apparatus 18 from AC power supplies 16A to 16C. An exposure light source laser driving section 2, an air conditioning machine controller 9, and a main body control system 11 have power breakers 4A, 4B, and 4C to receive power from the AC power supplies 16A to 16C, respectively. The power supplies 16A to 16C from the plant do not necessarily originate from the same power supply, and thus the systems for the exposure light source laser driving section 2, air conditioning machine controller 9, and main body control system 11 have power monitoring units 5A to 5C, respectively. The power monitoring units 5A to 5C, each of which determines the power failure rank for fluctuations in power, send the determination results to a laser controller 7, the air conditioning machine controller 9, and the main body control system 11, respectively.

Subsequent processing is performed in the same manner as in the first embodiment. The stop operation and the resumption of operation can separately be performed for each unit group of the exposure apparatus 18 as the monitoring targets of the power monitoring units 5A to 5C.

The second embodiment has three unit groups. A laser power supply section 6 and the laser controller 7 form unit group 1, an air conditioning machine power supply section 8 and the air conditioning machine controller 9 form unit group 2, and a main body control system power supply section 10, the main body control system 11, the sensor system 13, the main body actuator power supply section 14, and the actuator section 15 form unit group 3. The power monitoring units 5A to 5C monitor the power supply states (power failure states) of the unit groups, respectively.

As has been described above, the second embodiment has the following advantage. Assume that the plurality of AC power supplies 16A to 16C are provided to enable independent power supply to the units of the exposure apparatus 18 so as to avoid any increase in power capacity of an AC power supply for supplying power to the exposure apparatus 18. Even in this case, the effects described in the first embodiment can be obtained for each unit of the exposure apparatus 18 by separately performing the processing described in the first embodiment for the plurality of power monitoring units 5A to 5C using them.

[Application Example of Exposure Apparatus]

The manufacturing process of a semiconductor device using the above-mentioned exposure apparatuses will be described next.

Figure 9:
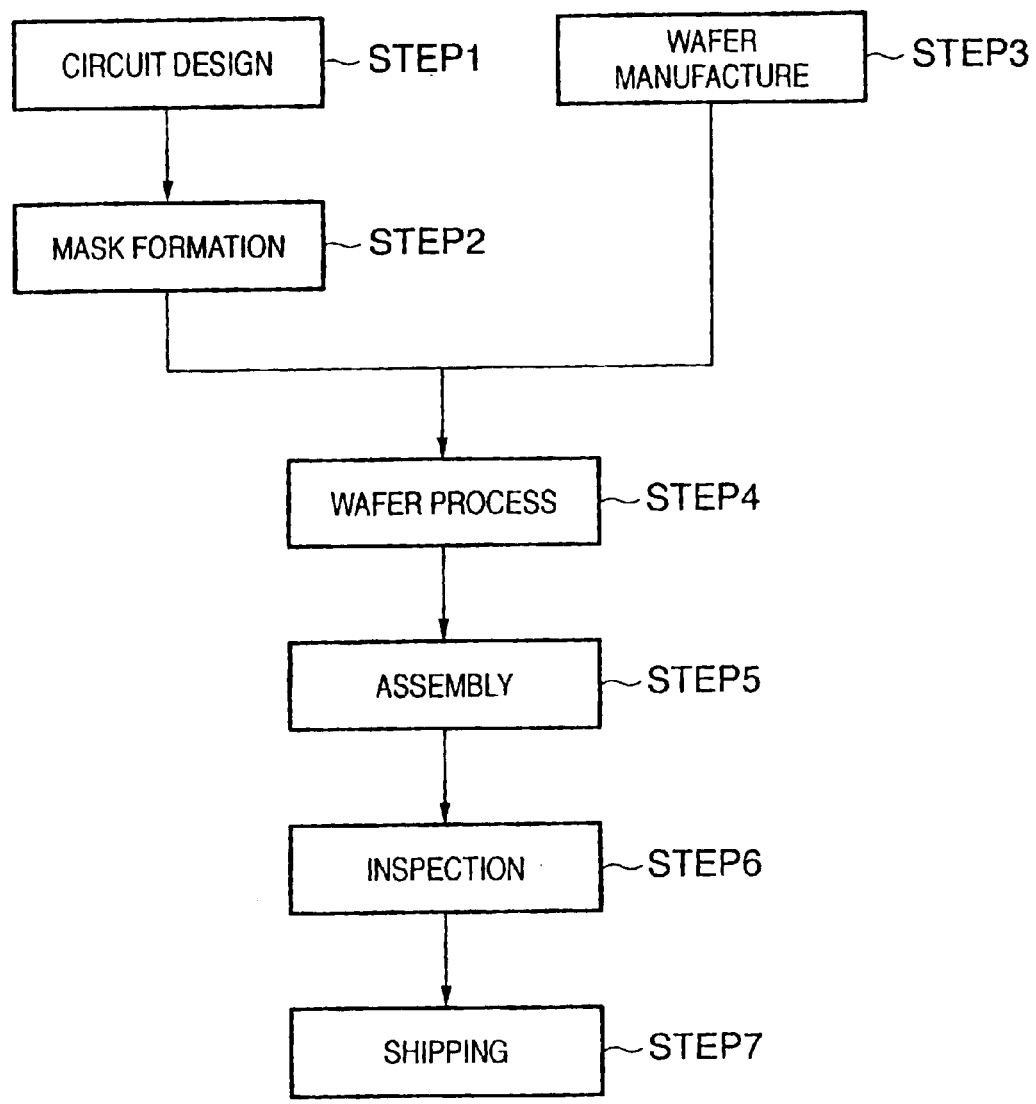
FIG. 9 is a flow chart showing the flow of the whole manufacturing process of a semiconductor device.

FIG. 9 shows the flow of the whole manufacturing process of the semiconductor device.

In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a preprocess, an actual circuit is formed on the wafer by lithography using the prepared mask and wafer.

Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test. After these steps, the semiconductor device is completed and shipped (step 7).

Figure 10:
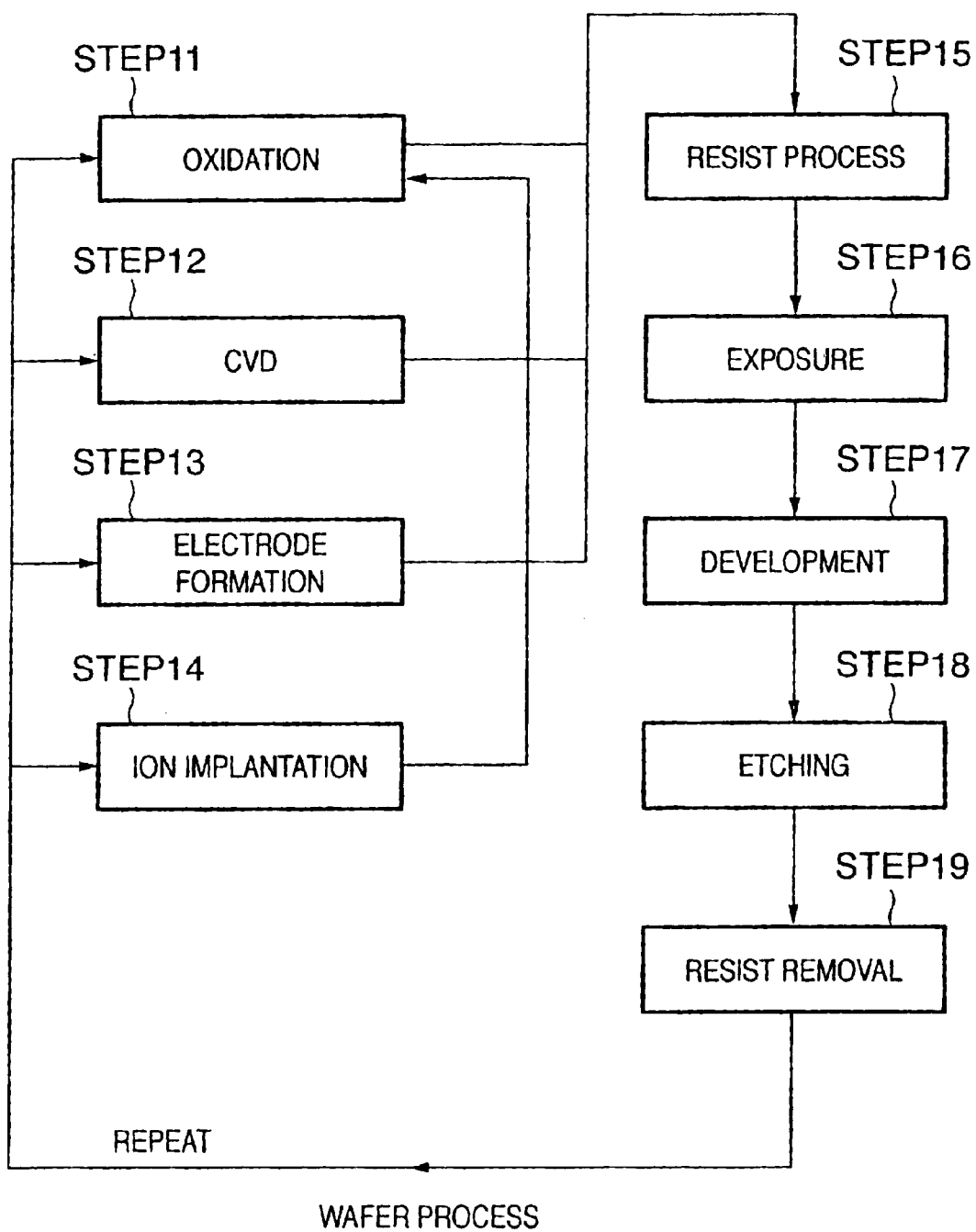
FIG. 10 is a flow chart showing the flow of the whole manufacturing process of the semiconductor device.

FIG. 10 shows the detailed flow of the above-mentioned wafer process.

In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatuses. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

Note that the present invention includes a case wherein the invention is achieved by directly or remotely supplying a software program that implements the functions of the aforementioned embodiments to a system or apparatus, and reading out and executing the supplied program code by a computer of that system or apparatus.

Therefore, the program code itself installed in a computer to implement the functional process of the present invention using the computer implements the present invention. That is, the present invention includes the computer program itself for implementing the functional process of the present invention.

In this case, the form of program is not particularly limited, and an object code, a program to be executed by an interpreter, script data to be supplied to an OS, and the like may be used as long as they have the program function.

As a recording medium for supplying the program, for example, a floppy (registered trademark) disk, hard disk, optical disk, magnetooptical disk, MO, CD-ROM, CD-R, CD-RW, magnetic tape, nonvolatile card, ROM, DVD (DVD-ROM, DVD-R) and the like may be used.

As another program supply method, the program may be supplied by establishing connection to a home page on the Internet using a browser on a client computer, and downloading the computer program itself of the present invention or a compressed file containing an automatic installation function from the home page onto a recording medium such as a hard disk or the like. Also, the program code that forms the program of the present invention may be segmented into a plurality of files, which may be downloaded from different home pages. That is, the present invention includes a WWW server which makes a plurality of users download a program file required to implement the functional process of the present invention by the computer.

Also, a storage medium such as a CD-ROM or the like, which stores the encrypted program of the present invention, may be delivered to the user, the user who has cleared a predetermined condition may be allowed to download key information that is used to decrypt the program from a home page via the Internet, and the encrypted program may be executed using that key information to be installed on a computer, thus implementing the present invention.

The functions of the aforementioned embodiments may be implemented not only by executing the readout program by the computer but also by some or all of actual processing operations executed by an OS or the like running on the computer on the basis of an instruction of that program.

Furthermore, the functions of the aforementioned embodiments may be implemented by some or all of actual processes executed by a CPU or the like arranged in a function extension board or a function extension unit, which is inserted in or connected to the computer, on the basis of an instruction of the program read out from the recording medium after that program is written in a memory of the extension board or unit.

As described above, according to the present invention, there can be provided a power monitoring unit capable of notifying a power supply destination of appropriate information on its operation to cause the power supply destination to efficiently operate, a control method therefor, and an exposure apparatus capable of efficiently operating by utilizing the power monitoring unit.

As many apparently widely different embodiments of the present invention can be made without departing from the spirit and scope thereof, it is to be understood that the invention is not limited to the specific embodiments thereof except as defined in the appended claims.

What is claimed is:

1. A power monitoring apparatus which monitors a power supply for failures, comprising:
   monitoring means for monitoring a voltage fluctuation range of the power supply and a duration of voltage fluctuations within the voltage fluctuation range;
   determination means for looking up a power failure rank table for determining a power failure rank of the power supply on the basis of the voltage fluctuation range and the duration obtained as a monitoring result from said monitoring means to determine the power failure rank of the power supply; and
   output means for outputting a power failure signal indicating the power failure rank determined by said determination means to a power supply destination of the power supply.

2. The apparatus according to claim 1, wherein the power failure rank comprises a rank defined by a predetermined voltage fluctuation range and a duration of voltage fluctuations within the predetermined voltage fluctuation range or a plurality of ranks defined by a plurality of different voltage fluctuation ranges and fluctuation durations.

3. The apparatus according to claim 1, further comprising storage means for storing the power failure rank table.

4. An exposure apparatus which has a power monitoring apparatus which monitors a power supply for failures and projects a pattern on a first substrate onto a second substrate to expose the second substrate to the pattern using a projection optical system,
   wherein the power monitoring apparatus comprises
   monitoring means for monitoring a voltage fluctuation range of the power supply and a duration of voltage fluctuations within the voltage fluctuation range,
   determination means for looking up a power failure rank table for determining a power failure rank of the power supply on the basis of the voltage fluctuation range and the duration obtained as a monitoring result from said monitoring means to determine the power failure rank of the power supply, and
   output means for outputting a power failure signal indicating the power failure rank determined by said determination means to a power supply destination of the power supply, and
   the exposure apparatus comprises
   control means for controlling operation of units constituting the exposure apparatus on the basis of the power failure rank indicated by the power failure signal output from the power monitoring apparatus.

5. The apparatus according to claim 4, wherein said control means performs any of operation of allowing the units to continue to operate, preparation for stopping operation, stop operation which allows resumption of operation upon recovery from a power failure, and stop operation which prohibits the resumption of operation without any intervention upon recovery from a power failure, and restarts operation in accordance with stop state upon recovery from a power failure.

6. The apparatus according to claim 4, wherein said control means uses a profile for controlling operation of the units constituting the exposure apparatus to control the units.

7. The apparatus according to claim 6, wherein said control means switches from the profile to a power failure profile on the basis of a power failure signal output from the power monitoring apparatus and uses the power failure profile to control the units.

8. The apparatus according to claim 6, wherein one of the units constituting the exposure apparatus comprises an actuator, and said control means performs stop operation by switching from a profile of the actuator in operation to a stop profile, stop operation at a point in time when acceleration of the actuator becomes zero, or stop operation without servo control on the basis of a power failure signal output from the power monitoring apparatus and restarts exposure operation upon recovery from a power failure.

9. An exposure apparatus which has a plurality of power monitoring apparatuses which monitor a power supply for failures and projects a pattern on a first substrate onto a second substrate to expose the second substrate to the pattern using a projection optical system,
   wherein units constituting the exposure apparatus are divided into unit groups, and each of the plurality of power monitoring apparatuses monitors power supply state of each unit group,
   each power monitoring apparatus comprises
   monitoring means for monitoring a voltage fluctuation range of the power supply and a duration of voltage fluctuations within the voltage fluctuation range,
   determination means for looking up a power failure rank table for determining a power failure rank of the power supply on the basis of the voltage fluctuation range and the duration obtained as a monitoring result from said monitoring means to determine the power failure rank of the power supply, and
   output means for outputting a power failure signal indicating the power failure rank determined by said determination means to a power supply destination of the power supply, and
   the exposure apparatus comprises
   control means for controlling operation of the unit groups on the basis of the power failure rank indicated by power failure signals output from the plurality of power monitoring apparatuses.

10. The apparatus according to claim 9, wherein said control means performs for each unit group any of operation of allowing the units in each unit group to continue to operate, preparation for stopping operation, stop operation which allows resumption of operation upon recovery from a power failure, and stop operation which prohibits the resumption of operation without any intervention upon recovery from a power failure, and restarts operation in accordance with stop state upon recovery from a power failure.

11. The apparatus according to claim 9, wherein said control means uses a profile for controlling operation of the units constituting the exposure apparatus to control the units.

12. The apparatus according to claim 11, wherein said control means switches from the profile to a power failure profile on the basis of a power failure signal output from the power monitoring apparatus and uses the power failure profile to control the units.

13. The apparatus according to claim 11, wherein one of the units constituting the exposure apparatus comprises an actuator, and said control means performs stop operation by switching from a profile of the actuator in operation to a stop profile, stop operation at a point in time when acceleration of the actuator becomes zero, or stop operation without servo control on the basis of a power failure signal output from the power monitoring apparatus and restarts exposure operation upon recovery from a power failure.

14. A semiconductor device manufacturing method of manufacturing a semiconductor device using an exposure apparatus which projects a pattern on a first substrate onto a second substrate to expose the second substrate to the pattern using a projection optical system, comprising:

an application step of applying a photosensitive agent to the second substrate;

an exposing step of exposing the second substrate by the exposure apparatus; and a development step of developing the exposed second substrate, wherein the exposure apparatus comprises a power monitoring apparatus which monitors a power supply for failures and control means for controlling operation of units constituting the exposure apparatus on the basis of a power failure rank indicated by a power failure signal output from the power monitoring apparatus, and the power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply.

15. A semiconductor device manufacturing method of manufacturing a semiconductor device using an exposure apparatus which projects a pattern on a first substrate onto a second substrate to expose the second substrate to the pattern using a projection optical system, comprising:

an application step of applying a photosensitive agent to the second substrate;

an exposing step of exposing the second substrate by the exposure apparatus; and a development step of developing the exposed second substrate, wherein the exposure apparatus comprises a plurality of power monitoring apparatuses which monitor a power supply for failures and control means for controlling operation of unit groups into which units constituting the exposure apparatus are divided, on the basis of a power failure rank indicated by a power failure signal output from each of the plurality of power monitoring apparatuses, each of the plurality of power monitoring apparatuses monitors power supply state of each unit group, and each power monitoring apparatus comprises monitoring means for monitoring a voltage fluctuation range of the power supply and a duration of voltage fluctuations within the voltage fluctuation range, determination means for looking up a power failure rank table for determining a power failure rank of the power supply on the basis of the voltage fluctuation range and the duration obtained as a monitoring result from the monitoring means to determine the power failure rank of the power supply, and output means for outputting a power failure signal indicating the power failure rank determined by the determination means to a power supply destination of the power supply.

16. A method of controlling a power monitoring apparatus which monitors a power supply for failures, comprising:

a monitoring step of monitoring a voltage fluctuation range of the power supply and a duration of voltage fluctuations within the voltage fluctuation range, a determination step of looking up a power failure rank table for determining a power failure rank of the power supply on the basis of the voltage fluctuation range and the duration obtained as a monitoring result in the monitoring step to determine the power failure rank of the power supply, and an output step of outputting a power failure signal indicating the power failure rank determined in the determination step to a power supply destination of the power supply.

17. A program for controlling a power monitoring apparatus which monitors a power supply for failures, comprising:

a program code for a monitoring step of monitoring a voltage fluctuation range of the power supply and a duration of voltage fluctuations within the voltage fluctuation range, a program code for a determination step of looking up a power failure rank table for determining a power failure rank of the power supply on the basis of the voltage fluctuation range and the duration obtained as a monitoring result in the monitoring step to determine the power failure rank of the power supply, and a program code for an output step of outputting a power failure signal indicating the power failure rank determined in the determination step to a power supply destination of the power supply.

* * * * *

UNITED STATES PATENT AND TRADEMARK OFFICE
CERTIFICATE OF CORRECTION

PATENT NO. : 6,909,372 B2
DATED : June 21, 2005
INVENTOR(S) : Takehiko Iwanaga et al.

It is certified that error appears in the above-identified patent and that said Letters Patent is hereby corrected as shown below:

<u>Column 17,</u>
Lines 33 and 47, "comprises" should read -- comprises: --.

<u>Column 18,</u>
Line 13, "monitor" should read -- monitors --.
Lines 21 and 36, "comprises" should read -- comprises: --.

<u>Column 19,</u>
Lines 12, 20 and 46, "comprises" should read -- comprises: --.
Lines 14 and 49, 'failures" should read -- failures; --.
Line 53, the right margin should be closed up.

<u>Column 20,</u>
Line 4, "comprises" should read -- comprises: --.

Signed and Sealed this

Twenty-seventh Day of December, 2005

JON W. DUDAS
*Director of the United States Patent and Trademark Office*